United States Patent [19]

Kleinert et al.

[11] Patent Number: 4,509,456
[45] Date of Patent: Apr. 9, 1985

[54] APPARATUS FOR GUIDING GAS FOR LP CVD PROCESSES IN A TUBE REACTOR

[75] Inventors: Michael Kleinert; Rainer Möller; Horst Stelzer, all of Dresden, German Democratic Rep.

[73] Assignee: VEB Zentrum für Forschung und Technologie Mikroelektronik, Dresden, German Democratic Rep.

[21] Appl. No.: 389,750

[22] Filed: Jun. 18, 1982

[30] Foreign Application Priority Data

Jul. 28, 1981 [DD] German Democratic Rep. ... 232136

[51] Int. Cl.$^3$ ............................................. C23C 13/08
[52] U.S. Cl. .................................. 118/715; 118/725; 118/730
[58] Field of Search ................ 118/719, 715, 725, 730

[56] References Cited

U.S. PATENT DOCUMENTS

| | | | |
|---|---|---|---|
| 3,900,597 | 8/1975 | Chruma et al. | 118/724 |
| 4,062,318 | 12/1977 | Ban et al. | 118/725 |
| 4,263,872 | 4/1981 | Ban | 118/730 |
| 4,290,385 | 9/1981 | Nakanisi et al. | 118/730 |
| 4,309,241 | 1/1982 | Garavaglia et al. | 118/719 |
| 4,316,430 | 2/1982 | Jolly et al. | 118/729 |

Primary Examiner—Sadie L. Childs
Attorney, Agent, or Firm—Jordan and Hamburg

[57] ABSTRACT

An apparatus for guiding gas through a tube reactor in low pressure chemical vapor deposition processes. The apparatus includes the tube reactor, a substrate mounting element in the interior of the tube reactor, to receive substrates in a generally parallel position with respect to each other along the substrate mounting element, a cup-shaped inner tube surrounding the substrate mounting element, a gas feed arranged within the inner tube, a gas discharge opening arranged in the inner tube at a point opposite to the gas feed, and an intermediate zone between the tube reactor and the inner tube. Preferably, the inner tube is eccentrically disposed within the tube reactor, to increase the size of the intermediate zone in the area of the gas discharge opening, thus facilitating passage of exhaust gas out of the inner tube. Typically, the substrate mounting can be rotated. The present apparatus and method thus provides that the processing-gas flow is suctioned off, in the flow direction, immediately after flowing through the intermediate zones of the substrates, and is suctioned out of the tube reactor outside the substrate areas.

11 Claims, 2 Drawing Figures

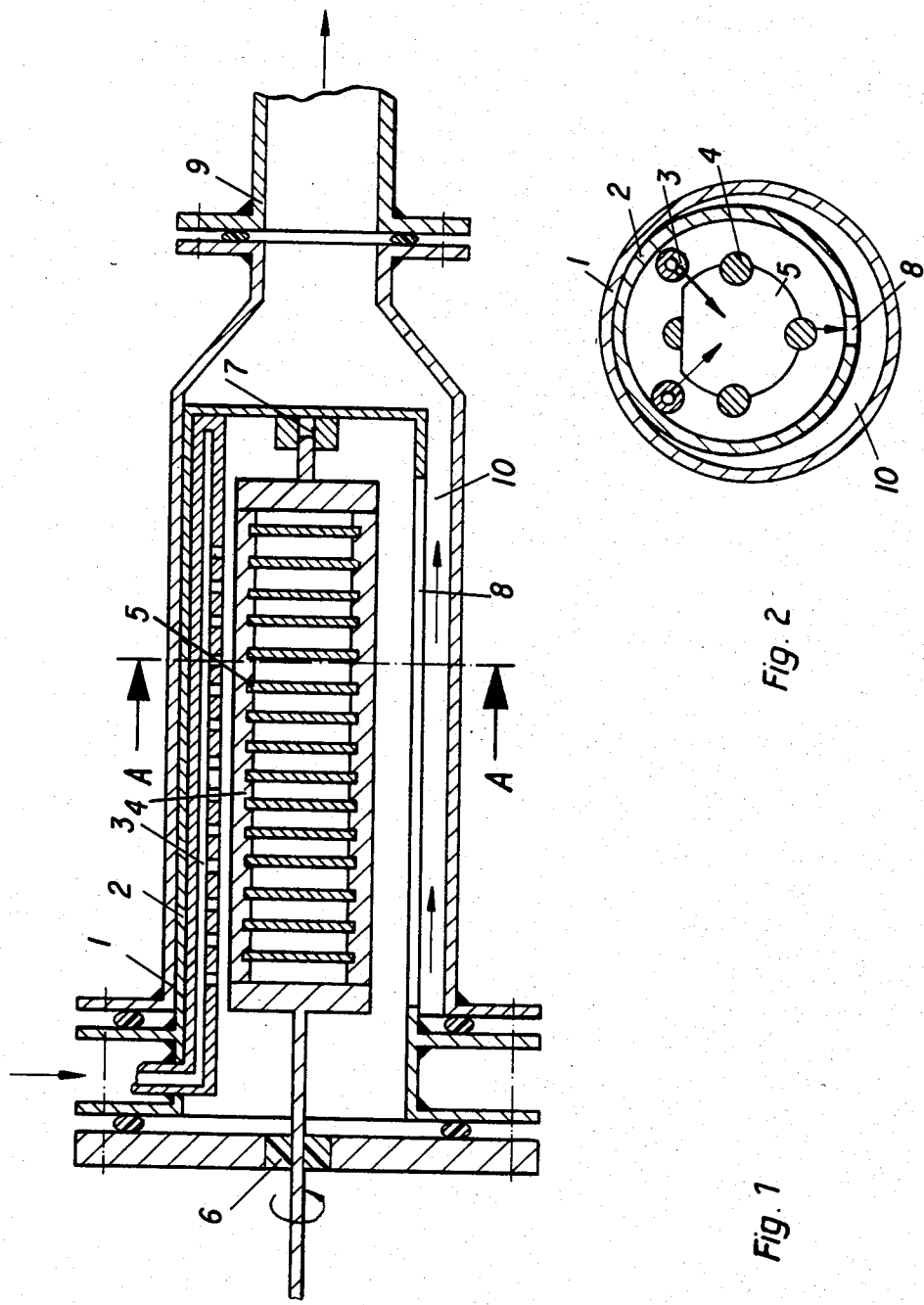

APPARATUS FOR GUIDING GAS FOR LP CVD PROCESSES IN A TUBE REACTOR

BACKGROUND OF THE INVENTION AND PRIOR ART STATEMENT

This invention is directed to the coating of disc-shaped material by means of LP CVD processes (low pressure chemical vapor deposition), especially for the processing of semiconductor substrates.

Tube reactors have become especially important with the introduction of chemical vapor-phase separation (CVD) under reduced pressure as well as the method of plasma corrosion. A simple tube reactor is described in DE-AS No. 2460 211 (U.S. Pat. No. 3,900,597). The substrates to be coated are placed centrally in the reactor with their surface normally parallel to the axis of the tube; herein, the gas inlet and the gas outlet are always located at opposite ends of the reactor tube. No special measures are required for guiding the gas. Although this reactor has been used with success for relatively less active processes, it cannot be used for highly active processes where, above all, the risk might be incurred of generating a strong, homogeneous gas-phase reaction that is strongly detrimental to high-quality deposition.

In these processes, the highly reactive gas or the components of a gas mixture must be guided by special means directly into the reaction zone where the substrates are located.

Known solutions (for instance, DE-OS No. 2750 882 or DD WP No. 121975 - normal pressure CVD) comprise guiding the reaction gases by means of thin tubes into the substrate area and from there over jets, in which the gas flow is guided into the intermediate zone between the substrate surfaces.

If various reactive components participate in coat formation, then these may also be guided through separate tubes in the described manner into the substrate area, being only mixed in close proximity to the disc. No special measures are taken to discharge the exhaust gases that have been contaminated with reaction products and particles; they are discharged by a pump connected at the exit of the reactor.

One disadvantage of this solution is that the gas flow is deviated in a tube axis direction to the reactor exit, which produces non-homogeneous coatings which can only be equalized through increased gas flow quantities. A particularly great disadvantage is that the used gases contaminated by reaction by-products and particles after flowing over the substrates, still remain for a certain time in the reaction area, where they flow along the opening between the substrate stacks and the tube wall, also penetrating the substrate intermediate zones. This is a great source of contamination for the substrate, which must be slowed by low concentrations of the processing gases—which results in low deposition rates.

The mentioned normal-pressure-CVD-arrangement (DD WP No. 121975) requires an additional inert gas flow, which is supplied at the reactor inlet, in order to rinse the dead spaces in the reactor and to shorten presence of the gases in the reactor.

DD WP No. 111 935 describes a special mode of gas discharge from a normal-pressure tube reactor. Herein, thin gas-outlet tubes that are provided with openings are arranged in the reactor area parallel to the substrate mountings. In LP CVD processes, the processing gas is suctioned off by vacuum pumps. Waste derived from the suctioning-off operation in the thin, slitted tubes is very large; this could only be compensated through highly over-sized pumps. This measure, however, would not be economical and also not feasible from a technical viewpoint.

SUMMARY OF THE INVENTION

An object of the present invention is to provide homogeneous, high-quality coating for a large number of substrates in an economical way, while lowering time and expenses for cleaning the tube reactor.

A further object of this invention is to provide a method and apparatus which serve for the coating of disc-shaped material by means of LP CVD processes (low pressure CVD), especially for the treatment of semiconductor substrates.

The invention has as an additional object the provision of uniform coating of a large number of substrates, and prevention of contamination of the coatings and of the apparatus.

The invention has as another object the provision of a method and an apparatus for guiding gas for LP CVD processes, which results in a substantial reduction of processing gas requirements as well as in a reduction of contamination of the layers by waste particles.

These and other objects and advantages of the present invention will become evident from the description which follows.

The present invention basically entails the provision of a method and apparatus for guiding gas for LP CVD processes into and within a tube reactor, in which the substrates to be coated are placed parallel to each other, in perpendicular position relative to a rectilinear substrate mounting element, and at equal distances from one another, and the processing gas or mixture of processing gases is fed into the intermediate zones between the substrates, and in which the processing gas flow is suctioned off immediately, in the direction of the gas flow, after flowing through the intermediate areas, being fed out of the tube reactor outside the substrate mounting areas.

The present invention is further characterized by the provision of a method and apparatus for guiding gas for LP CVD processes into and through a tube reactor, which reactor is provided with gas-supply pipes, gas-discharge pipes, a heating device, and a rectilinear substrate mounting member to receive substrates placed parallel to each other and perpendicular with respect to the mounting, in order to carry out the method, in which the substrate mounting element or member in the tube reactor is surrounded by a cup-shaped inner tube, in which the gas-supply pipes for introducing the processing gases into the intermediate zones between substrates are disposed and arranged, and in which the inner tube is provided with a gas-discharge opening on the opposite side from the gas-supply pipes, proportioned and preferably parallel to the substrate mounting, and in which an intermediate zone is provided between the inner tube and the tube reactor.

In summary, the present invention is directed to an apparatus for guiding gas through a tube reactor in low pressure chemical vapor deposition processes. The apparatus includes the tube reactor, a substrate mounting element in the interior of the tube reactor, to receive substrates in a generally parallel position with respect to each other along the substrate mounting element, a cup-shaped inner tube surrounding the substrate mounting element, a gas feed arranged within the inner tube, a gas discharge opening arranged in the inner tube at a point opposite to the gas feed, an intermediate zone between the tube reactor and the inner tube. Preferably, the inner tube is eccentrically disposed within the tube reactor, to increase the size of the intermediate zone in the area of the gas discharge opening, thus facilitating passage of exhaust gas out of the inner tube. Typically, the substrate mounting can be rotated. The present apparatus and method thus provides that the processing-gas flow is suctioned off, in the flow direction, immediately after flowing through the intermediate zones of the substrates, and is suctioned out of the tube reactor outside the substrate areas.

In accordance with the present invention, the objects are accomplished in that the processing gas flow is suctioned off in the flow direction immediately after flowing through the intermediate zones between the substrates, being diverted outside the substrate area and guided out of the tube reactor.

The apparatus of this invention for guiding gas distinguishes itself by the fact that the substrate mounting in the tube reactor is encircled by a cup-shaped inner tube in which the gas-supply pipes for introducing the processing gases into the intermediate zones of the substrate have been arranged, in which the portion or region of the inner or inside tube that lies opposite the gas-inlet pipes is furnished or equipped with a gas-outlet opening that corresponds to the dimensions of the substrate mounting. Herein, the inside tube is arranged in the reactor in such a way that an intermediate zone is created between the inside or inner tube and the tube reactor.

The inside or inner tube is preferably eccentrically arranged inside the tube reactor, so that the intermediate area is larger in the area of the gas-outlet opening than at the other points between the inside tube and the tube reactor.

The advantage of a solution according to the present invention is that, by its application, the extremely productive tube reactor principle for less active processes can also be used for very active processes.

In addition, the short gas path in the reaction zone ensures a uniform impacting zone of fresh processing gas on all substrates and ensures, in contrast to other solutions, an increased deposition rate with low gas consumption. Productivity in coating can thereby be increased and pump capacity requirements can be lowered.

The short gas path in the reaction zone at the same time represses the undesired homogeneous gas-phase reaction and ensures optimum utilization of the process gases used. In addition, a highly uniform coating of the total charge is achieved.

Since a separate exit is provided for the exhaust gas, which is discharged outside of the substrate area, this further contributes to a high-quality coating action, as the risk of contamination by particles is eliminated, the cleaning cycle of the tube reactor being substantially increased.

BRIEF DESCRIPTION OF THE INVENTION

The invention accordingly consists in the method and tube reactor apparatus for guiding gas in low pressure chemical vapor deposition processes as described supra, and as will appear infra from the description of the drawings and preferred embodiments, and elucidated in the appended claims.

The invention will now be described in more detail by way of an example. In the drawing, FIG. 1 illustrates a tube reactor represented schematically and in a sectional elevation view, FIG. 2 illustrates a sectional plan view, taken along the line A—A in FIG. 1.

DETAILED DESCRIPTION OF A PREFERRED EMBODIMENT

The following is a glossary of terms, elements and structural members as referenced and employed in the present invention.

GLOSSARY 1. tube reactor
2. inner tube
3. gas supply pipe
4. substrate mounting
5. substrate
6. rotating bushing
7. outer bearing
8. gas discharge opening
9. discharge pipe
10. intermediate zone The present invention thus essentially entails an arrangement of LP CVD apparatus including at least one foraminous generally rectilinear gas supply feed pipe (3), the gas supply feed pipe (3) being disposed within the inner tube (2) and being contiguous with a continuous inner wall area of the inner tube (2), and being spaced from and parallel to the substrate mounting element (4), means to pass a gas stream into the gas supply feed pipe (3), the inner tube (2) having a gas discharge opening (8) disposed generally on the opposite side of the inner tube (2) from the continuous wall area adjacent the gas supply feed pipe (3), so that the gas stream is discharged into the inner tube (2) from the openings in the gas feed or supply pipe (3), and flows transversely to the longitudinal axis of the tube reactor (1), and between and across the surfaces of the substrates (5), and is discharged from the inner tube (2) through the gas discharge opening (8) in the inner tube (2), and into the intermediate zone (10) between the inner tube (2) and the tube reactor (1).

In a preferred mode, the inner tube (2) is eccentrically disposed within the tube reactor (1), whereby the size of the intermediate zone (10) between the inner tube (2) and the tube reactor (1) is increased in the area of the gas discharge opening (8) in the inner tube (2), so that the passage of discharged exhaust gas out of the inner tube (2) is facilitated. Typically, the substrate mounting element (4) includes a plurality of discrete and spaced-apart members (see FIG. 2), the members being generally rectilinear and oriented substantially parallel to the longitudinal axis of the tube reactor (1), (see FIG. 1), each of the members having a plurality of spaced-apart notches or the like (see FIG. 1), to receive the substrates (5).

A cup-shaped inner tube 2 is arranged in tube reactor 1, encircling the substrate mounting 4. The gas supply pipes 3 are arranged inside the inner tube 2. The processing gas flow is guided between the substrates 5, which are oriented in parallel and in a perpendicular position relative to the substrate mounting, through non-illustrated jets. The inner tube 2 is provided with a gas-outlet opening 8. The gas-outlet opening 8 extends over the whole length of substrate mounting 4, being arranged opposite the gas-supply pipes 3. The substrate mounting 4 is rotatably mounted inside inner tube 2 by means of rotating bushing 6 and outer bearing 7. The suctioning of the tube reactor is effected through discharge pipe 9 by means of a vacuum pump. The tube reactor 1 is arranged inside a non-illustrated diffusion oven.

The method of this invention will now be explained by the mode of operation of the aforedescribed apparatus.

Tube reactor 1 is initially pumped out to a preselected low pressure level and heated up to the reaction temperature. Thereafter, processing gas is fed through the gas-supply pipes 3, into the intermediate areas of and between the substrates 5. The processing gas flow is suctioned off, in the flow direction, immediately after it has crossed the intermediate areas, by means of gas outlet opening 8, being guided to the discharge pipe 9 outside the substrate areas in the intermediate area 10 between tube reactor 1 and inside or inner tube 2. For a better discharge of waste gas, the inner tube 2 is eccentrically arranged inside the tube reactor, so that the intermediate area 10 adjacent the gas-outlet opening 8 and between the inner tube 2 and the tube reactor 1 is larger than at the other points. To improve homogeneity in the deposition operation, the substrate mounting 4 is rotated during the deposition process.

EXAMPLE

Experiments conducted in accordance with the method and apparatus of this invention, in a coating deposition of $SiO_2$ from $SiH_4$ (40 ml/m) and $O_2$ (40 ml/min) at 450° C. with a charge of 25 pieces, resulted in a deposition rate in a range between 50–100 nm/min.

It thus will be seen that there is provided a method and tube reactor apparatus, for guiding gas in low pressure chemical vapor deposition processes (within the tube reactor), which attains the various objects of the invention, and which is well adapted for the conditions of practical use. As various alternatives within the scope of the present invention will occur to those skilled in the art, besides those alternatives, modifications, embodiments and variations mentioned supra, it will be understood that the invention is not to be limited to such alternatives or the like, but extends fully to all equivalents, both functional and structural, and is to be limited only by the recitations in the appended claims, and equivalents thereof, both functional and structural.

We claim:

1. An apparatus for guiding gas through a tube reactor and in contact with a plurality of substrates within said tube reactor, in low pressure chemical vapor deposition processes, which comprises a substantially rectilinear tube reactor, a generally centrally oriented substantially rectilinear substrate mounting element disposed within the interior of said tube reactor, said substrate mounting element being substantially parallel to the longitudinal axis of said tube reactor, and being provided with means to receive and mount a plurality of substrates, so that said substrates are disposed in a generally parallel and spaced-apart disposition with respect to each other along said substrate mounting element, and in a substantially perpendicular orientation relative to both said substrate mounting element and the longitudinal axis of said tube reactor, a generally rectilinear cup-shaped inner tube within and spaced from said tube reactor, so that an intermediate zone is formed between said inner tube and said tube reactor, said inner tube being disposed about and surrounding said substrate mounting element, and being oriented generally parallel to the longitudinal axis of said tube reactor, at least one foraminous substantially rectilinear gas supply feed pipe, said gas feed pipe being disposed within said inner tube and being contiguous with a continuous inner wall area of said inner tube, and being spaced from and parallel to said substrate mounting element, means to pass a gas stream into said gas feed pipe, said inner tube having a gas discharge opening disposed generally on the opposite side of said inner tube from said continuous wall area adjacent said gas feed pipe, so that said gas stream is discharged into said inner tube from the openings in said gas feed pipe and flows transversely to the longitudinal axis of said tube reactor and between and across the surfaces of said substrates, and is discharged from said inner tube through the gas discharge opening in said inner tube and into said intermediate zone between said inner tube and said tube reactor, and means to remove discharged gas from said intermediate zone and out of said tube reactor, so that the gas stream flow is suctioned off, in the flow direction, immediately after flowing transversely to the longitudinal axis of said tube reactor and between and across the surfaces of said substrates, and is suctioned out of said tube reactor outside the substrate areas.

2. The apparatus of claim 1 in which the inner tube is eccentrically disposed within the tube reactor, whereby the size of the intermediate zone between the inner tube and the tube reactor is increased in the area of the gas discharge opening in the inner tube, so that the passage of discharged exhaust gas out of the inner tube is facilitated.

3. The apparatus of claim 1 in which the substrate mounting element includes a plurality of discrete and spaced-apart members, said members being substantially rectilinear and oriented substantially parallel to the longitudinal axis of the tube reactor, each of said members having a plurality of spaced-apart notches or the like, to receive the substrates.

4. The apparatus of claim 1 in which the number of gas feed pipes is two, each of said two gas feed pipes being spaced apart from the other gas feed pipe and being contiguous with a continuous inner wall area of the inner tube.

5. The apparatus of claim 1 in which the openings in the foraminous gas feed pipe are aligned in a rectilinear array along the gas feed pipe and facing the substrates.

6. The apparatus of claim 1 in which the gas discharge opening in the inner tube is a generally rectilinear slot opening which extends parallel to the longitudinal axis of the tube reactor and over the entire length of the substrate mounting element, and opposite to the gas feed pipe.

7. The apparatus of claim 1, together with means to rotate the substrate mounting element about its longitudinal axis.

8. The apparatus of claim 1 in which both the tube reactor and the inner tube are generally cylindrical, each having a generally circular cross-section.

9. The apparatus of claim 1 in which the substrates are generally disc-shaped.

10. The apparatus of claim 1 in which the substrates are semiconductor substrates.

11. The apparatus of claim 1 in which the low-pressure chemical vapor deposition process is the coating deposition of $SiO_2$ from $SiH_4$ and $O_2$ at about 450° C. and the deposition rate is in a range between 20 to 100 nm/min.

* * * * *